United States Patent
Roiz Wilson

(10) Patent No.: US 9,093,139 B2
(45) Date of Patent: Jul. 28, 2015

(54) COUNTERBALANCED-SWITCH MRAM

(75) Inventor: Jannier Maximo Roiz Wilson, Santa Clara, CA (US)

(73) Assignee: III HOLDINGS 1, LLC, Wilmington, DE (US)

(*) Notice: Subject to any disclaimer, the term of this patent is extended or adjusted under 35 U.S.C. 154(b) by 510 days.

(21) Appl. No.: 13/442,829

(22) Filed: Apr. 9, 2012

(65) Prior Publication Data

US 2015/0023096 A1    Jan. 22, 2015

Related U.S. Application Data

(60) Provisional application No. 61/473,303, filed on Apr. 8, 2011.

(51) Int. Cl.
*G11C 11/00* (2006.01)

(52) U.S. Cl.
CPC ........................... *G11C 11/00* (2013.01)

(58) Field of Classification Search
USPC ......... 365/48, 55, 62, 66, 74, 78, 80–93, 100, 365/130, 131, 148, 158, 171–173, 225.5, 365/243.5; 977/933–935
See application file for complete search history.

(56) References Cited

U.S. PATENT DOCUMENTS

| | | | |
|---|---|---|---|
| 8,565,012 B1 | 10/2013 | Mani | |
| 2005/0099724 A1* | 5/2005 | Nakamura et al. | 360/125 |
| 2006/0028862 A1 | 2/2006 | Min et al. | |
| 2006/0034118 A1* | 2/2006 | Saito et al. | 365/158 |
| 2006/0221674 A1* | 10/2006 | Braun et al. | 365/158 |
| 2007/0297220 A1* | 12/2007 | Yoshikawa et al. | 365/158 |
| 2008/0273380 A1* | 11/2008 | Diao et al. | 365/171 |
| 2009/0219754 A1 | 9/2009 | Fukumoto | |
| 2011/0116306 A1 | 5/2011 | Suzuki et al. | |
| 2014/0042569 A1 | 2/2014 | Mani | |

* cited by examiner

*Primary Examiner* — Harry W Byrne
(74) *Attorney, Agent, or Firm* — McAndrews, Held & Malloy, Ltd.

(57) ABSTRACT

A magnetic memory cell is provided. The cell comprises first and second free layers; and an intermediate layer separating the first and second free layers, wherein the first and second free layers are magnetostatically coupled.

20 Claims, 14 Drawing Sheets

COUNTERBALANCED-SWITCH MRAM

This application claims the benefit of priority to U.S. Provisional Patent Application No. 61/473,303 entitled "Counterbalanced-Switch MRAM Configurations" filed Apr. 8, 2011.

FIELD

Embodiments of the invention relate to magnetic random access memory (MRAM) configurations with low switching field, negligible bit-to-bit disturbance and small cell size.

BACKGROUND

Conventional magnetic random access memory (MRAM) may comprise a stack of several layers. Some of the layers (known as free layers) may comprise ferromagnetic materials, the magnetization of which may be flipped under the effect of an applied magnetic field (free layer), while others (known as fixed layers) have fixed magnetizations.

Normally, the stack sits at the intersection of two cross wires, standing in-between them. These wires provide the magnetic field capable of flipping the magnetization in the free layer by simultaneously passing electric current through them. MRAM cells have two stable magnetization configurations that can be selected by flipping the magnetization from one configuration to the other. One configuration represents a memory state "1" and the other the state "0".

The stack constitutes a magnetic tunnel junction (MTJ), which has different electric resistance depending on the orientation of the magnetization in the free layer relative to the magnetization in the fixed layer. Normally, MRPM uses the parallel and anti-parallel magnetization configurations to provide two very different values of resistance (low and high, respectively) to represent logical values "1" or "0". The reading circuitry connected to each cell senses the resistance of the cell by passing current through it.

SUMMARY

Conventional MRAM configurations have the relative disadvantage of requiring relatively large magnetic fields for switching thermally stable cells with dimensions below 0.1 micron. Another disadvantage is the potentially large bit-to-bit disturbance due to net magnetization of the free magnetic layer. Furthermore, in the 1R1T (1R1T=1 resistor-1 transistor per cell) conventional MRAM configurations the need for a read electrode to connect the MTJ stack to the read transistor leads to significant area penalty to the cell. All those issues are eliminated in the Counterbalanced-Switch MRAM configurations here presented. These new configurations simultaneously allow low switching field, high memory density and low bit-to bit disturbance.

Akin to the conventional MRAM configuration, Counterbalanced-Switch MRAM has a cross metal wires addressing scheme for writing data on the memory cells. The new cell configuration relies however on different positioning of magnetic layers compared to conventional MRAM. In Counterbalanced-Switch MRAM one or both of the metal wires are sandwiched by free magnetic layers. These sandwiching free layers are magnetostatically coupled in anti-ferromagnetic configuration. This anti-ferromagnetic configuration allows reducing the cell's stray magnetic field on others cells to insignificant values. The magnetic field generated by the wire passing in-between magnetic layers simultaneously rotates the magnetization in these layers in the same sense of rotation.

The magnetostatic coupling between sandwiching layers allows the couple to behave like a counterbalanced weight lifting mechanism in which the movement of one side readily transmits to the other side. In this case the magnetization rotation in one magnetic layer is transmitted to the coupled magnetic layer through magnetostatic coupling. This mechanism is here called Counterbalanced-Switch mechanism and has the advantage over conventional MRAM of substantially reducing the current-generated magnetic field required to switch a cell. There can be many different configurations to the Counterbalanced-Switch MRAM, some of which are presented here, but they all have in common the Counterbalanced-Switch mechanism.

In some embodiments of Counterbalanced-Switch. MRAM the metal wires required for writing data in the cells have magnetic walls. These magnetic walls not only participate in the switching mechanism but also contribute to the cell stability and to shielding of stray magnetic field.

For sensing data each cell has a magnetic tunnel junction (MTJ) which includes one of the free magnetic layers, a tunneling layer and a fixed layer. Counterbalanced-Switch MRAM configurations have the advantage over conventional MRAM of not requiring a read electrode going around one of the metal lines to connect the MTJ to the read transistor. Therefore, the cell size in these configurations is intrinsically smaller than in conventional MRAM.

Other aspects of the invention will be apparent from the detailed description that follows.

BRIEF DESCRIPTION OF THE DRAWINGS

While the appended claims set forth the features of the present invention with particularity, the invention, together with its objects and advantages, will be more readily appreciated from the following detailed description, taken in conjunction with the accompanying drawings, wherein:

6 with magnetic walls 13. a) Configuration with magnetic walls only on the top metal line. b) Configuration with magnetic walls only on the bottom metal line. c) Configuration with magnetic walls on both the bottom and top metal lines.

Figure 3:
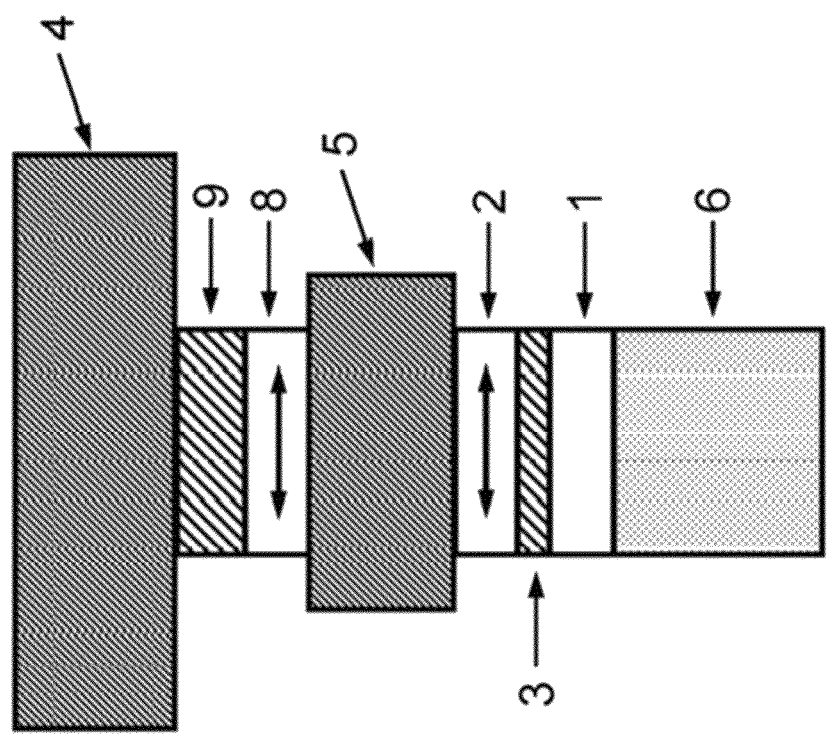
FIG. 3 shows a basic configuration for a Counterbalanced-Switch MRAM cell, in accordance with one embodiment of the invention.
Figure 6:
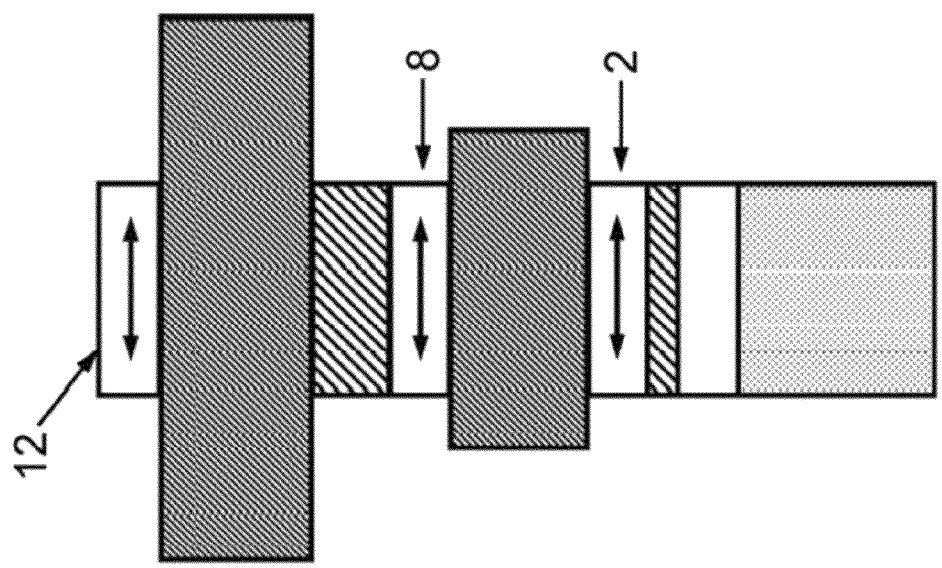
FIG. 6 shows a basic Counterbalanced-Switch MRAM cell with three free layers. There is an extra layer 12 on top of the configuration of FIG. 3.
Figure 10:
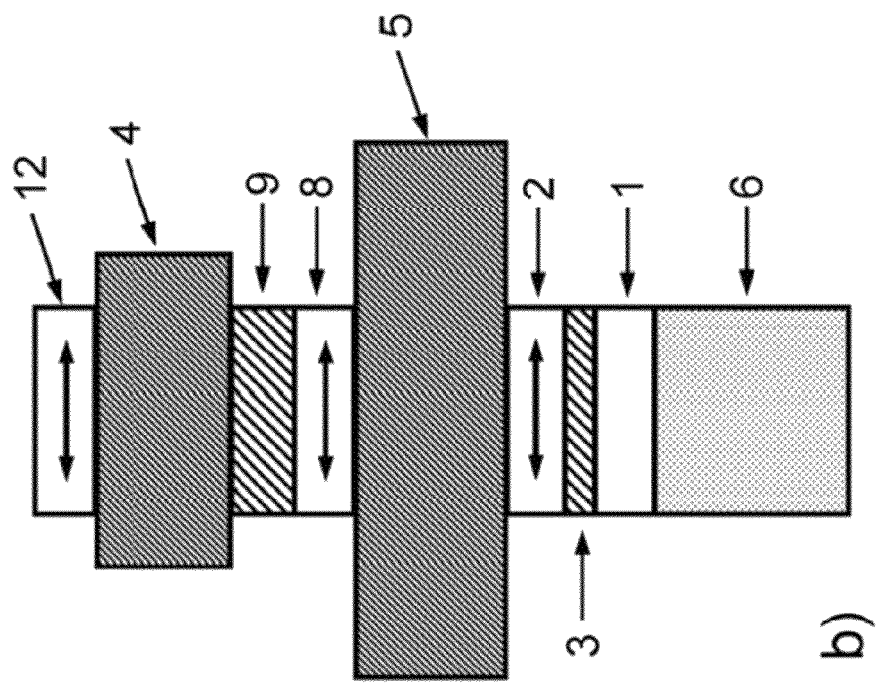
Figure 10:
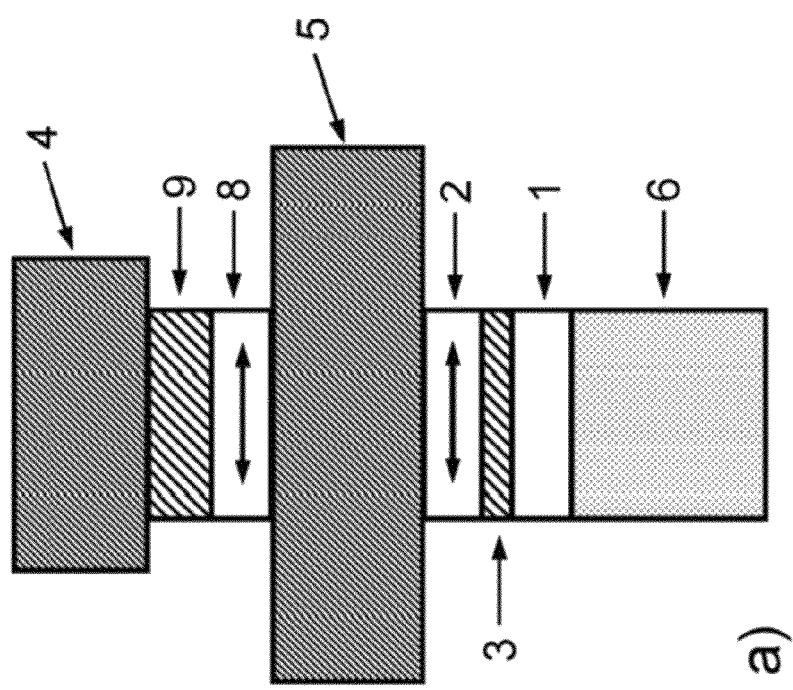

FIG. 10 shows a basic Counterbalanced-Switch MRAM cells akin to configurations from FIG. 3 and FIG. 6 but with direction of the bottom and top metal lines interchanged.

Figure 11:
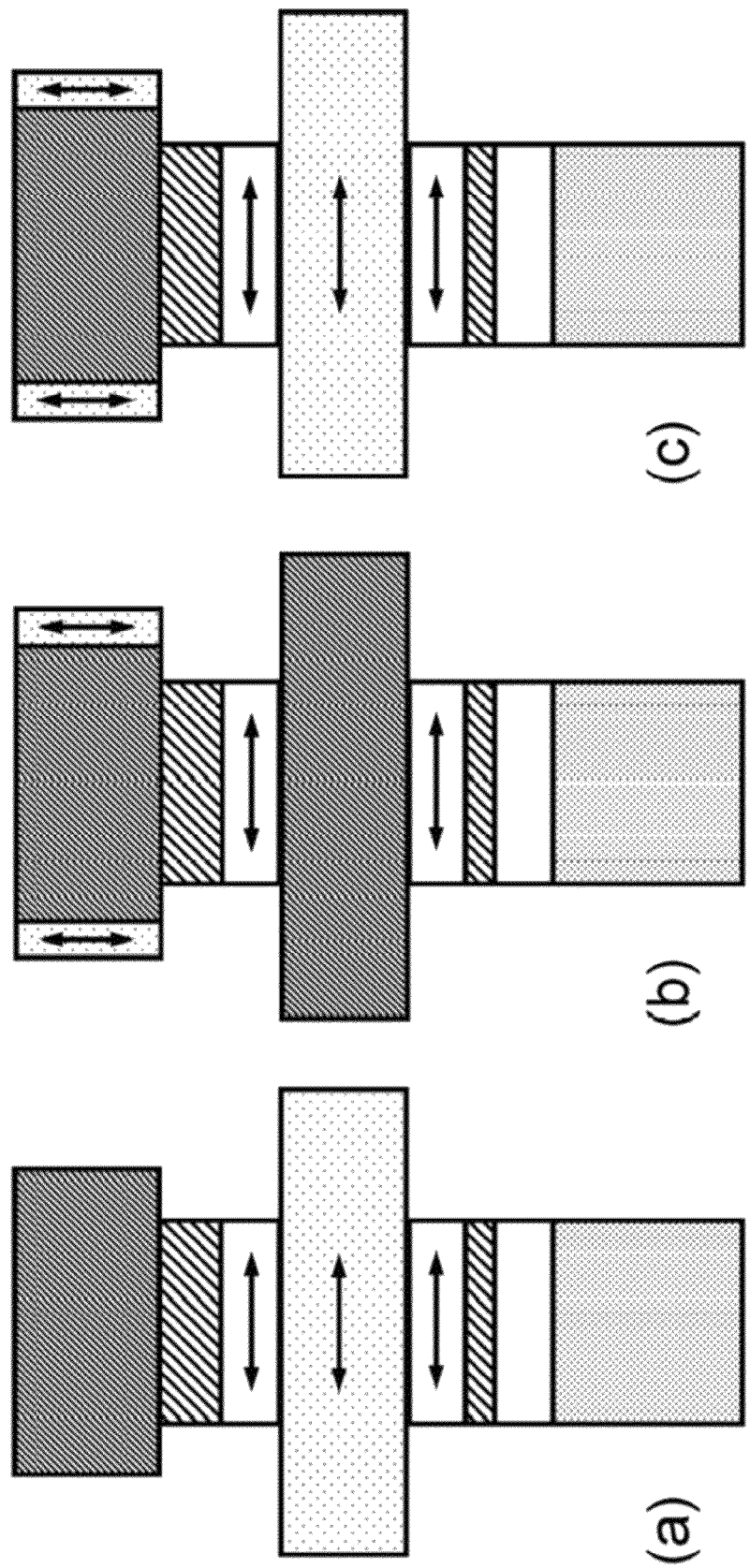

FIG. 11 shows configurations resulting from the combination of magnetic walls with basic configuration from FIG. 10a).

Figure 12:
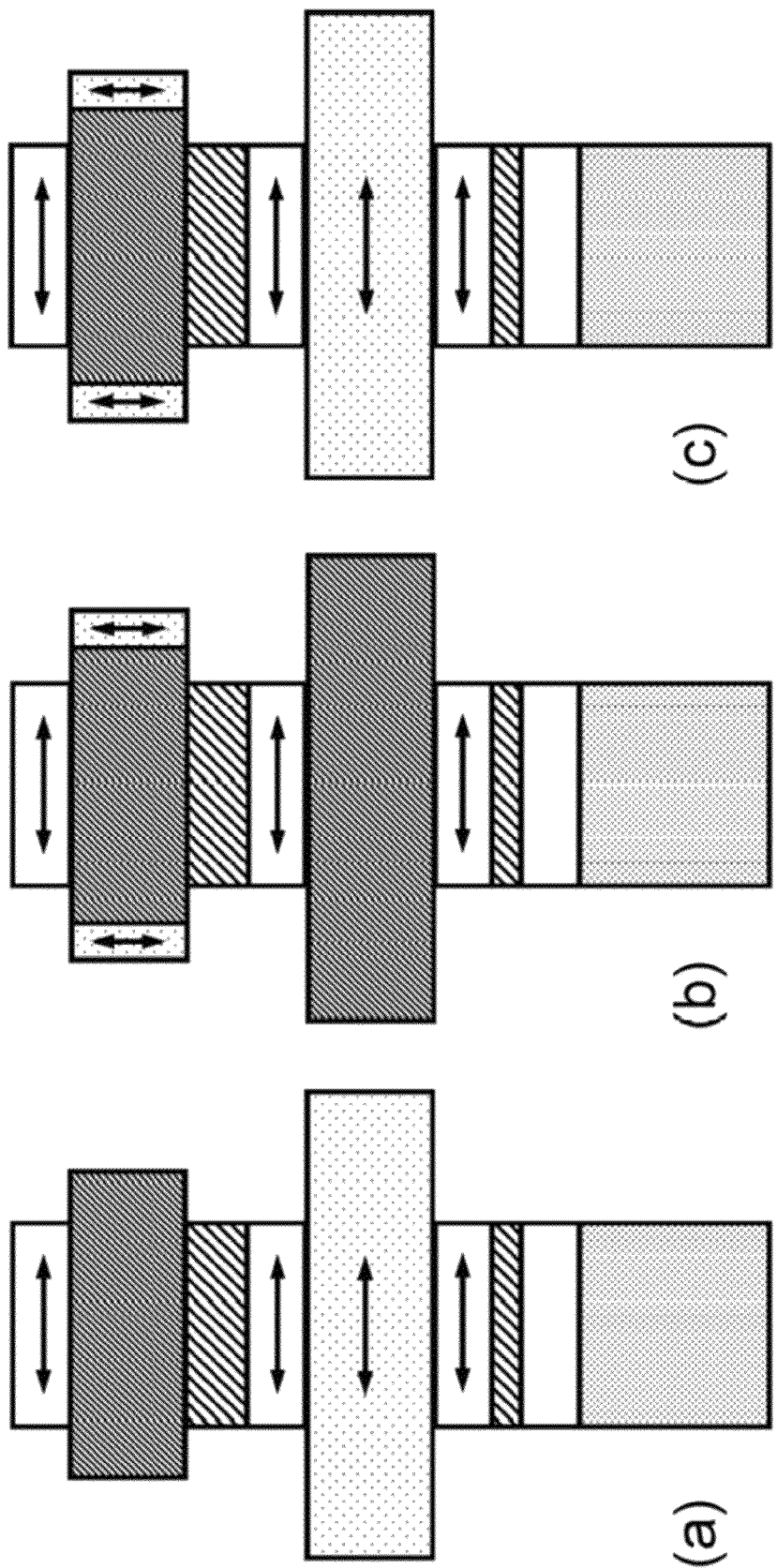

FIG. 12 shows configurations resulting from the combination of magnetic walls with basic configuration from FIG. 10b).

Figure 13:
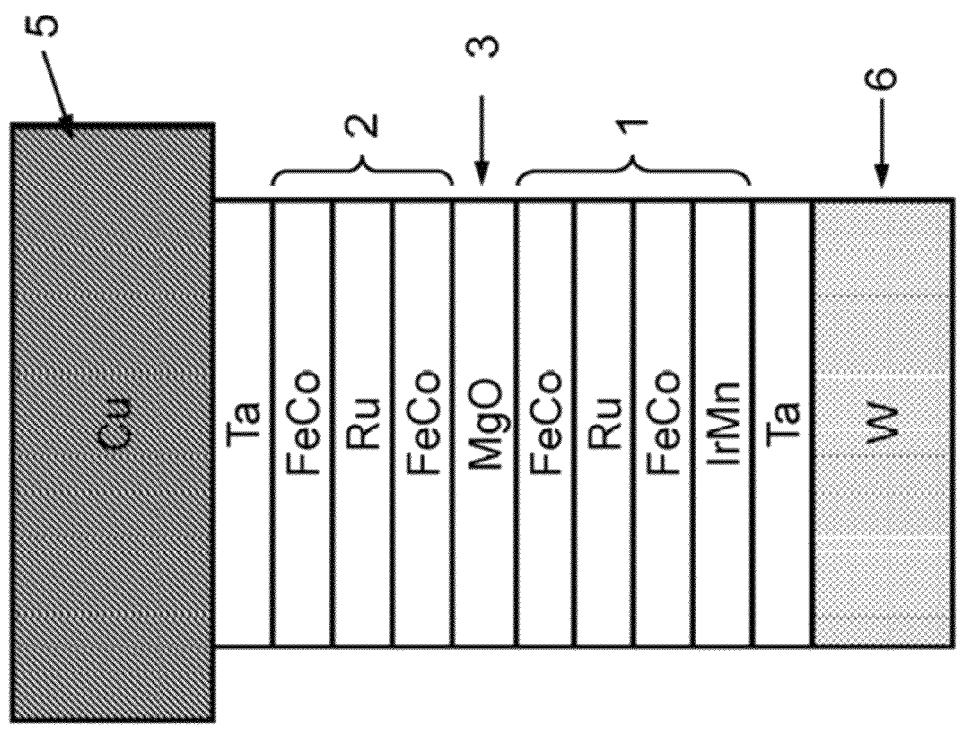

FIG. 13 shows a layer structure of one embodiment of MTJ stack for a Counterbalanced-Switch MRAM cell.

Figure 14:
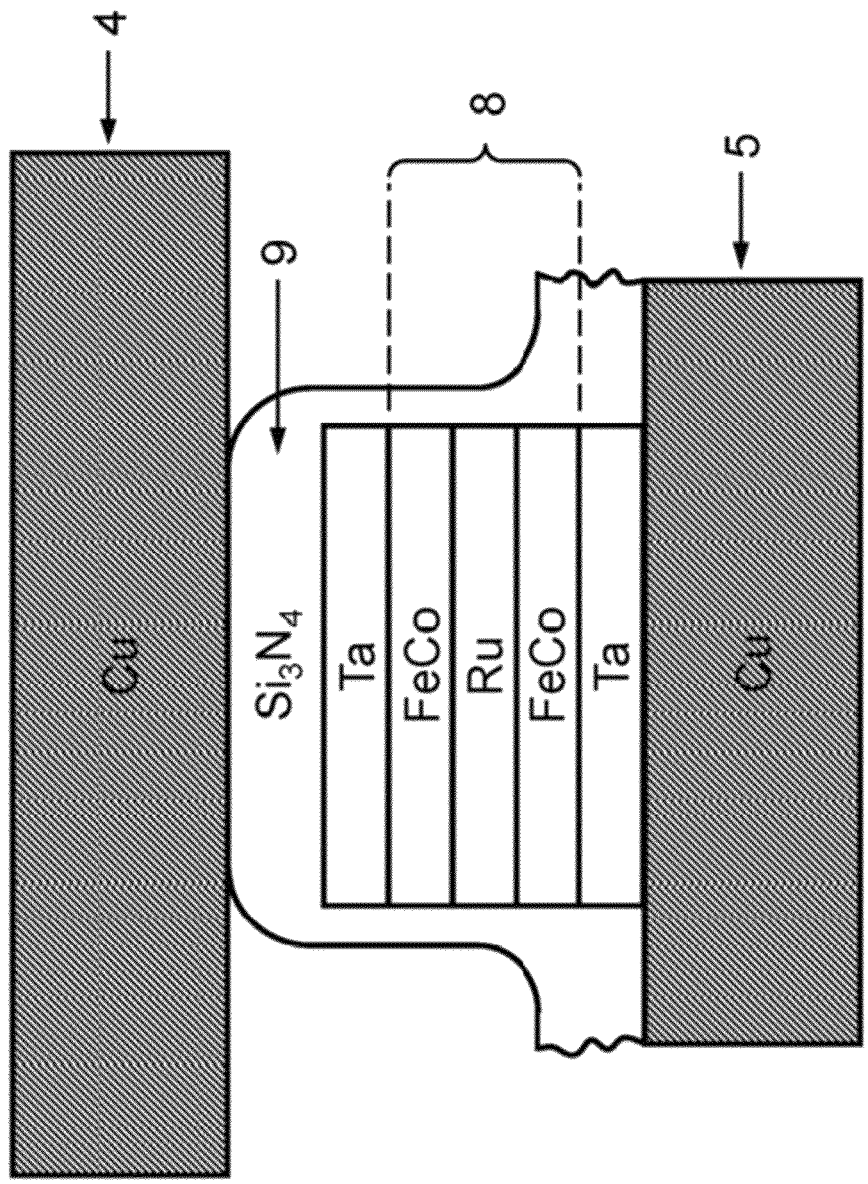

FIG. 14 shows a layer structure of one embodiment of the stack containing free layer 8 for a Counterbalanced-Switch MRAM cell.

DETAILED DESCRIPTION

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form only in order to avoid obscuring the invention.

Reference in this specification to "one embodiment" or "an embodiment" means that a particular feature, structure, or characteristic described in connection with the embodiment is included in at least one embodiment of the invention. The appearance of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Moreover, although the following description contains many specifics for the purposes of illustration, anyone skilled in the art will appreciate that many variations and/or alterations to said details are within the scope of the present invention. Similarly, although many of the features of the present invention are described in terms of each other, or in conjunction with each other, one skilled in the art will appreciate that many of these features can be provided independently of other features. Accordingly, this description of the invention is set forth without any loss of generality to, and without imposing limitations upon, the invention.

Figure 1:
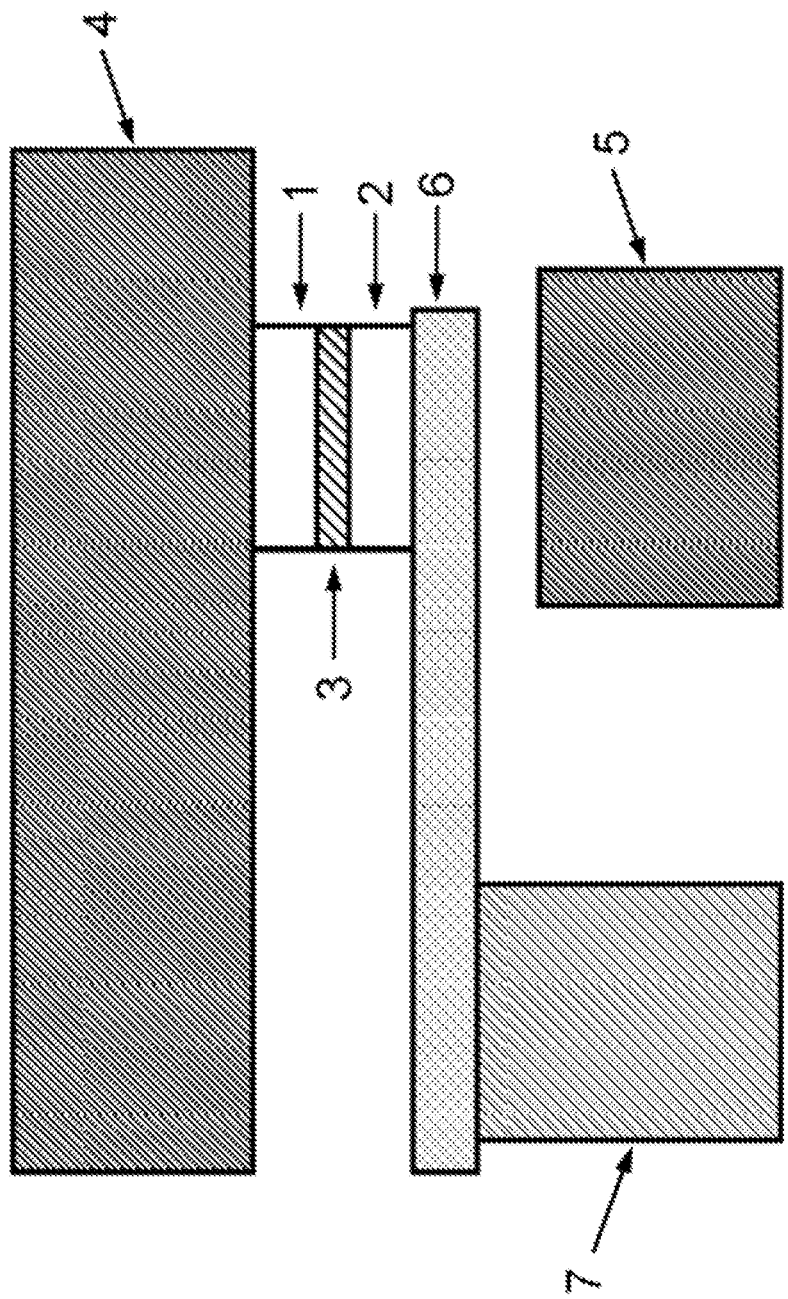
FIG. 1 shows a configuration for a conventional MRAM cell.

Conventional MRAM memories consist of an array of MTJ cells. A cross sectional view of the most conventional MRAM cell configuration is shown in FIG. 1. The cells have and MTJ stack which is composed of a fixed magnetic layer 1 in which the magnetization is pinned down under normal conditions, a tunneling layer 3 which is a thin dielectric, and a free magnetic layer 2, the magnetization of which can rotate under magnetic field generated by currents going through the metal lines 4 and 5. In some embodiments layers 1 and 2 have interchanged positions. The fixed magnetic layer 1 and the free magnetic layer 2 each may be composed of several layers. Other auxiliary layers of the stack were not represented for simplicity, but only the main layers. Metal line 4 is oriented in the left-right direction and metal line 5 is oriented perpendicularly to the paper plane, so that the MTJ stack sits at the intersection. The cells also have an electrode 6 which in the 1R1T MRAM configuration is connected to a read transistor through the via stack 7. In conventional MRAM (1R1T configuration) this electrode (6) needs to avoid contact with the bottom conductor 5. For that purpose it extends to one side away from the conductor path, which may lead to some area penalty to the cell.

Figure 2:
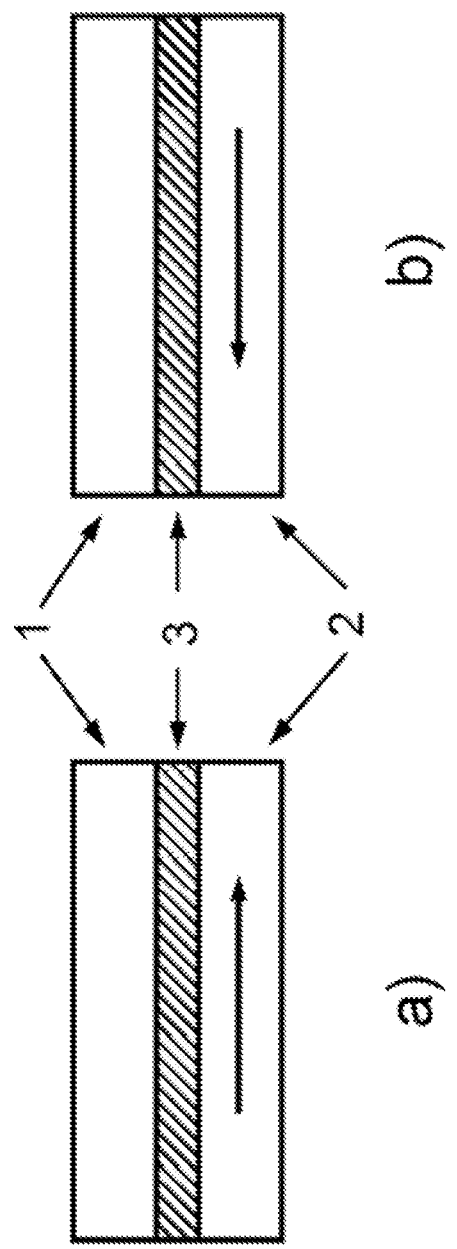
FIG. 2 shows the two stable magnetization configurations of the MTJ stack.

Conventional MRAM cells have two stable magnetization configurations, as is shown by the configurations a) and b) in FIG. 2. Referring to FIG. 2, the net magnetization orientation in each layer is represented with arrows. As will be seen the magnetization of the free layer 2 in configuration a) is opposite that of the magnetization of the free layer 2 in the configuration b). Fixed layer 1 may or may not have a net magnetization; but in any case, the magnetization of the side of it that is in contact with tunnel layer 3, is fixed in some direction. Each configuration represents either a memory state "1" or a "0". Data ("1" or "0") is written in an MTJ cell by applying a magnetic field with certain orientation on the cell. The magnetic field required to switch a cell from one configuration to the other is called the "switching field". A magnetic field applied in the same direction as but with magnitude lower than the switching field cannot switch the cell.

In order to provide the switching field, current is applied to both metal lines 4 and 5. The switching field is the result of the vector sum of the current-induced fields on the free layer of the cell. Conventional MRAM cells are designed so that none of these two components alone is enough to switch an MTJ cell. Therefore, only the cells standing in the intersection of these wires have both components of the switching field. However, all the cells standing along one of the current-carrying wires but not at the intersection of two current-carrying wires will be subjected to only one of the components of the switching field. This is a potential problem for conventional MRAM as some of these non-addressed cells may switch under one component of the switching field, due to cell-to-cell variations in coercivity that result from manufacturing processes. This problem is called the "half-select" problem.

The switching field is a function of the shape, materials, dimensions, and spatial configuration of magnetic layers. As cell dimensions are reduced the switching field increases, provided that thermal stability is kept the same. This poses scalability issues for MRAM which needs to provide higher switching field with the handicap of increased interconnect resistance and decreased CMOS voltage supply, as features dimensions are reduced. The cross section shrinkage of metal interconnects not only increases its resistance per unit length but also brings about the potential for interconnect failure caused by electro-migration.

The most basic configuration for Counterbalanced-Switch MRAM is shown in FIG. 3, in accordance with one embodiment. In this configuration a metal line 5 is sandwiched between free magnetic layers 2 and 8. The arrows drawn inside a layer with heads at both ends mean that the magnetization is not fixed in that layer. The free magnetic layer 2 is connected to fixed magnetic layer 1 through tunneling layer 3 forming an MTJ. The metal line 5 serves as the top electrode for the MTJ. The free magnetic layer 8 is not part of any electrical circuit; it is only for magnetic purposes. Thus, there is no electrical connection between the metal line 5 and metal line 6 through the magnetic layer 8—dielectric layer 9 prevents that from happening. Without changing its main functionality each of the layers represented can be composed of different layers.

The free magnetic layers 2 and 8 are coupled magnetostatically. Therefore, the magnetizations in these two layers always oppose each other, so that they switch simultaneously.

For this to happen the magnetic layers 2 and 8 need to be sufficiently close to each other. This means that the coupling magnetic field must be much larger than the switching field. A schematic representation of the coupling magnetic field between layers 2 and 8 is shown in FIG. 4, with the aid of the curved arrows 10.

Figure 4:
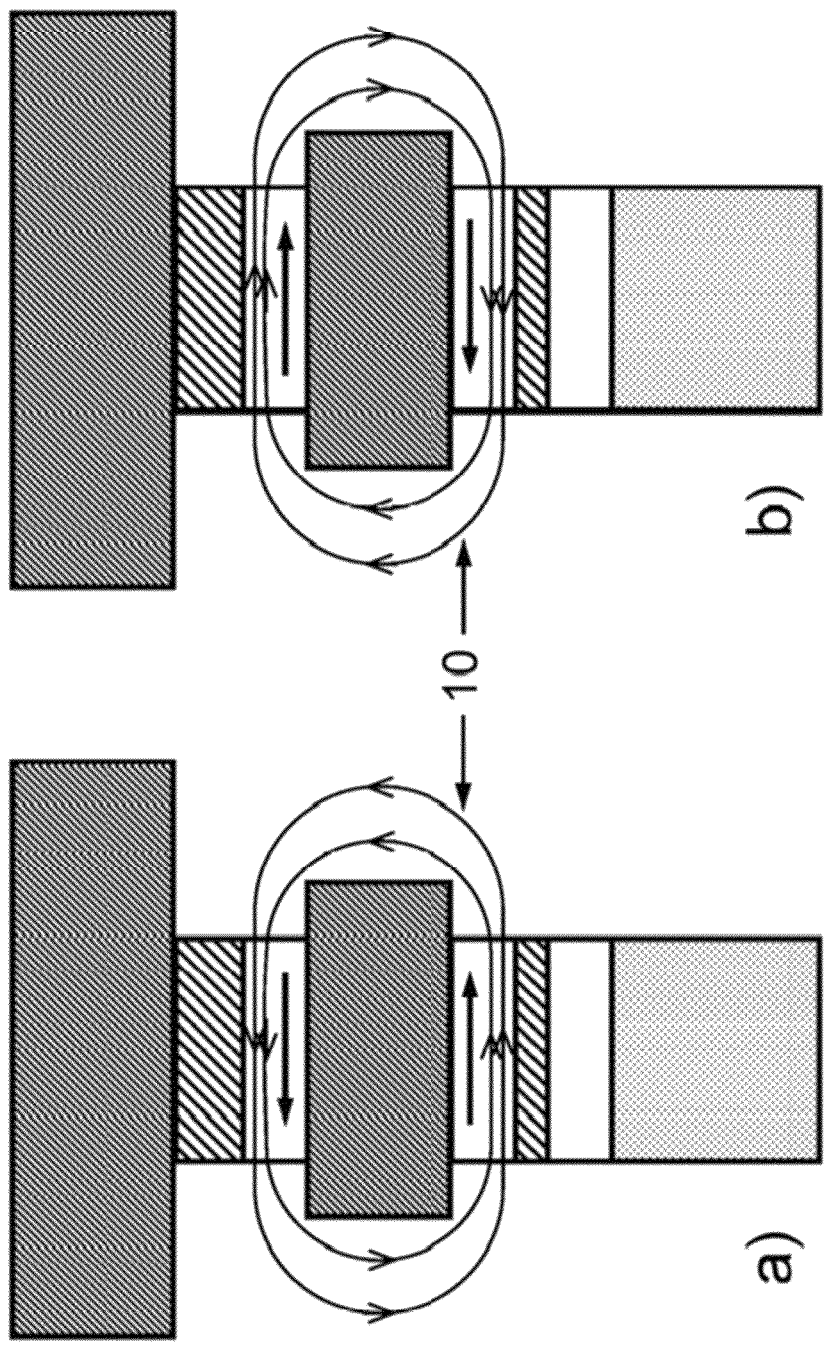
FIG. 4 shows a schematic representation of the coupling magnetic field 10 between the free layers of a Counterbalanced-Switch MRAM cell.

As is the case with conventional MRAM, the Counterbalanced-Switch MRAM has two stable magnetization configurations, like the ones represented in FIG. 4 a) and b). Each one represents either memory state "1" or "0". For reading, current flows through metal line 5 (see FIG. 3) and goes down to electrode 6, passing through the MTJ formed by layers 2-3-1.

The anisotropy, the materials, the shape and the dimensions of the free magnetic layers 2 and 8 can be in principle completely different. In some embodiments the anisotropy of the free magnetic layer 2 can be relatively low and that of 8 relatively high, so that layer 8 constitutes the storage layer and 2 just a sensing layer. In other embodiments the anisotropy of 2 can be relatively high and that of 8 relatively low, so that the storage layer is basically 2 and 8 is only an auxiliary layer. Anisotropy can also be more evenly shared between layers 2 and 8. One way to accomplish low anisotropy in 2 or 8 is to use soft magnetic materials in their layers and to make their shape highly symmetric, as for example a square or a circle.

Figure 5:
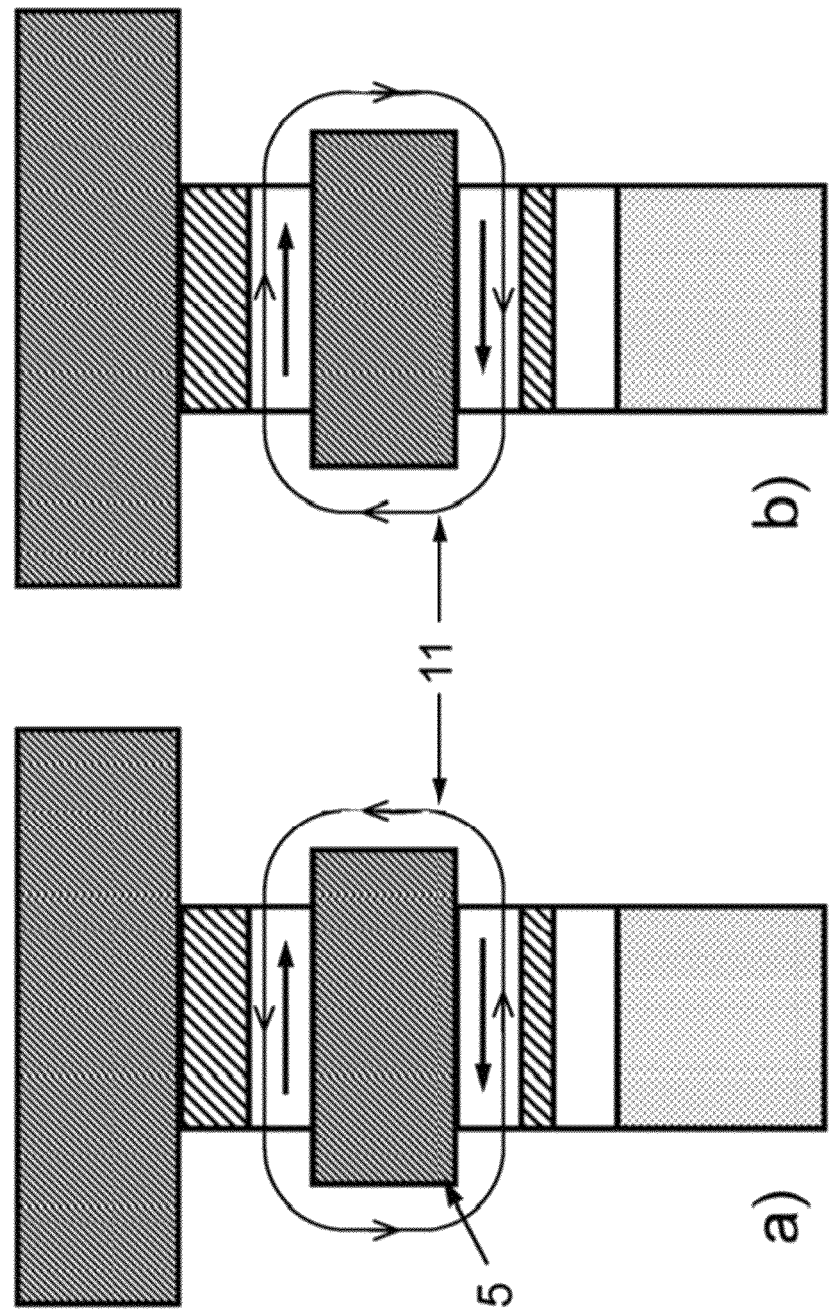
FIG. 5 shows a schematic representation of the magnetic field 11 induced by current flowing through metal line 5. a) The field points in the same direction and sense as the magnetizations in the free layers. b) The field points in the opposite sense as case a).

When current is applied on the metal line 5 a closed loop magnetic field is generated around the metal line, as shown in FIG. 5. This magnetic field sets the direction and sense of rotation of the magnetization in the magnetic layers 2 and 8. The torque this magnetic field exerts on the magnetization of both layers 2 and 8 is pointed in the same direction and sense. Layers 2 and 8 are strongly magnetostatically coupled, so most of the torque exerted on each of them by the current-induced magnetic field is readily transmitted to the other. In this manner, the rotation of the magnetization in one layer (2/8) contributes positively to the rotation of the magnetization in the other (8/2). This positive feedback mechanism allows reducing the field needed to switch the cell. This magnetization rotation mechanism in many respects is similar to a counterbalanced weight lifting mechanism in which the movement of one side is readily transmitted to the other side. For that reason this switching mechanism is here called Counterbalanced-Switch mechanism.

The reduction in switching field due to the Counterbalanced-Switch mechanism allows reducing the current through the metal lines. This reduction in current requirement can also lead to lower current density through the metal interconnects and thus to lower voltage requirements and lower risk of interconnect failure due to electro-migration. All of this translates in higher scalability potential than conventional MRAM.

To avoid half-select, the magnetic field induced by current going through metal line 5 should not be enough to switch the magnetization in the layers 2 and 8. For that purpose it is necessary to have a contribution of the magnetic field induced by current going through metal line 6. The magnetic field from this metal line has the same direction on both magnetic layers 2 and 8. Thus, the layers 2 and 8 act against each other under this field. Nevertheless, as the distance from metal line 6 to the magnetic layer 8 is shorter than to the magnetic layer 2 the current-induced magnetic field is larger on 8 than on 2. That provides the net torque needed to switch the cell.

The Counterbalanced-Switch cell configuration produces negligible stray magnetic field on neighboring cells. The low stray field is achieved by selecting adequate thickness for the anti-ferromagnetically coupled layers and the distance between these layers, so that the net horizontal field produced by the cell is negligible on the storage layer of the closest neighboring cells. Horizontal field refers to the stray magnetic field lying in the same plane as the cell magnetization. As the free layers of the cell at all times remain anti-ferromagnetically coupled their horizontal stray field on their neighbors is always small regardless of the cell's magnetization angle. This constitutes an advantage over conventional MRAM which has intrinsically higher stray magnetic field because the net magnetization of its free layer acts unhindered on neighboring cells. Consequently, Counterbalanced-Switch MRAM allows bringing cells closer and thus intrinsically allows higher cell density than conventional MRAM.

In FIG. 6 an extra magnetic layer 12 is placed on top of the configuration of FIG. 3. This layer must be magnetostatically coupled to layer 8. This configuration thus has counterbalancing effect in the switching direction and in the perpendicular direction as well. Consequently, the current requirement is lower than in the configuration of FIG. 3.

Figure 7:
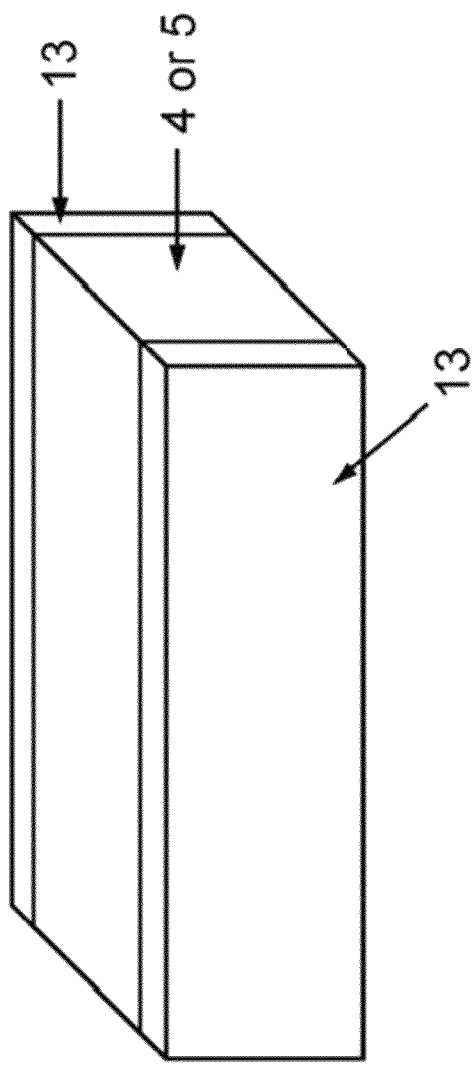
FIG. 7 shows a three-dimensional representation of a fragment of metal line 4 or 5 with magnetic walls 13.
Figure 8:
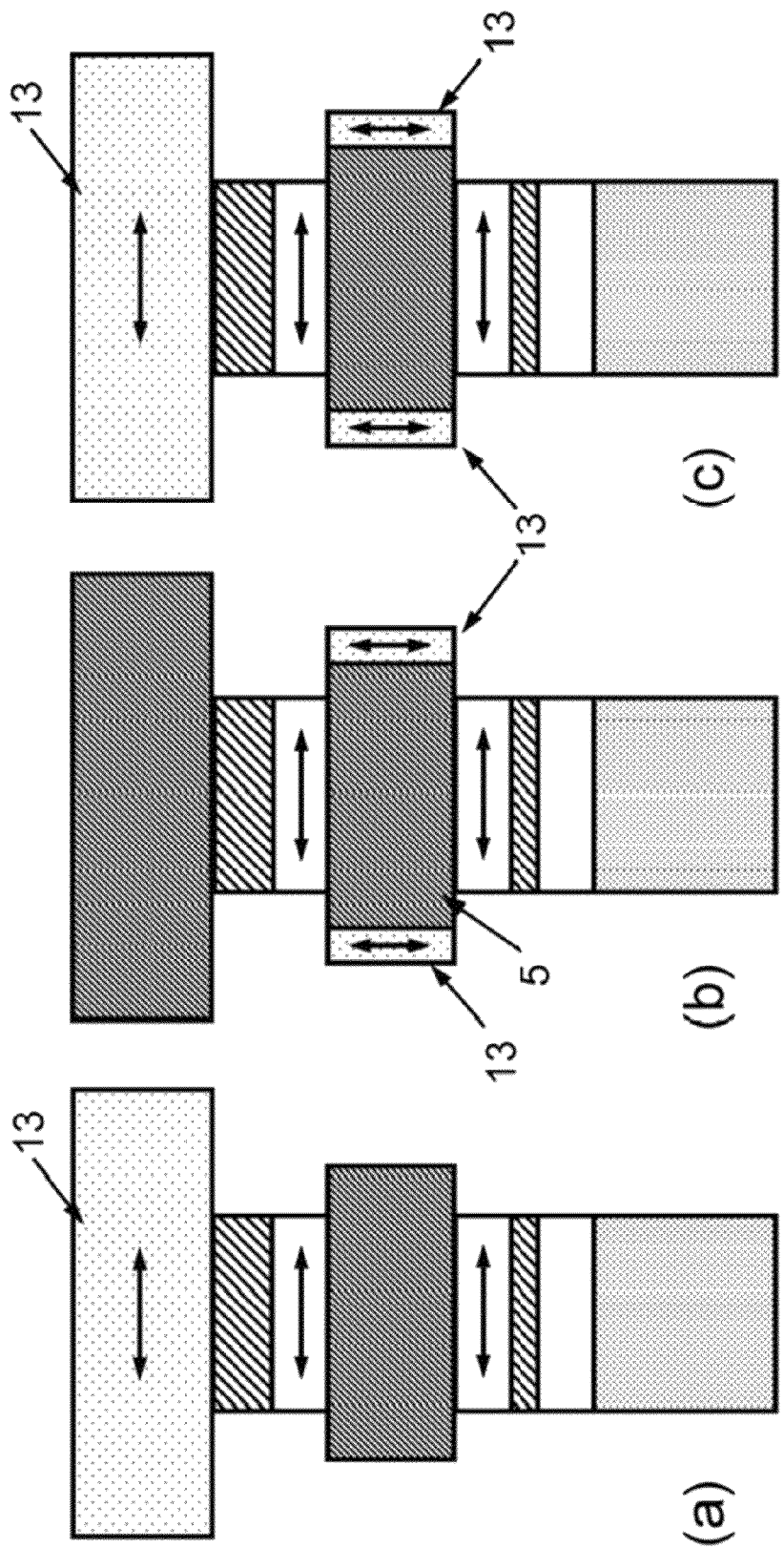
FIG. 8 shows a counterbalanced-Switch MRAM cells resulting from the combination of basic configuration of FIG. 3 with magnetic walls 13. a) Configuration with magnetic walls only on the top metal line. b) Configuration with magnetic walls only on the bottom metal line. c) Configuration with magnetic walls on both the bottom and top metal lines.
Figure 9:
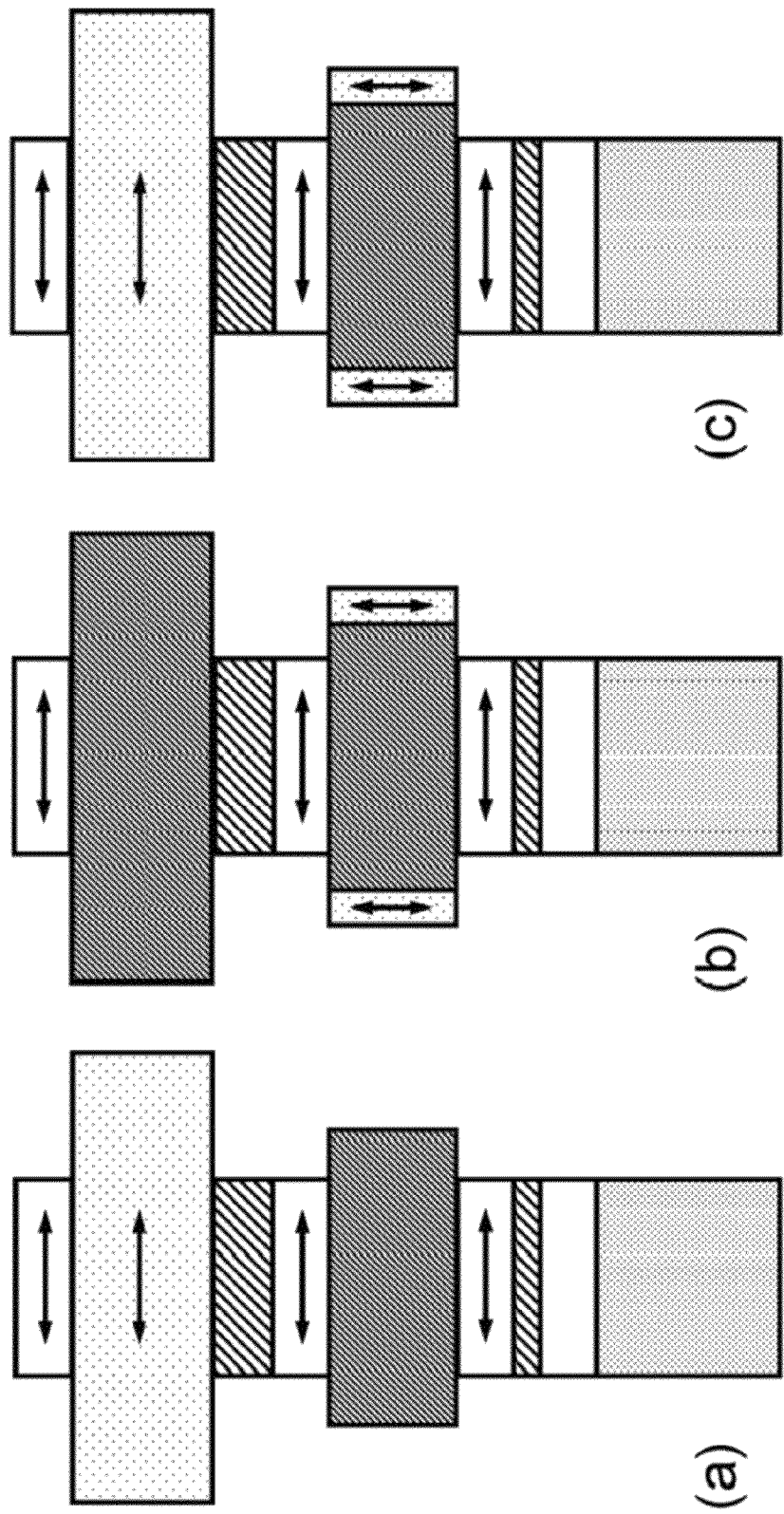
FIG. 9 shows a counterbalanced-Switch MRAM cells resulting from the combination of basic configuration of FIG.

Magnetic walls can also be incorporated to the Counterbalanced-Switch cell configurations. These walls are thin layers of soft ferromagnetic or high magnetic permeability material covering the side walls of the metal lines. A schematic representation of the walls 13 is shown in FIG. 7. Combining magnetic walls with the basic cell configurations shown in FIGS. 3 and 6 leads to the many different cell configurations shown in FIGS. 8 and 9. The magnetic walls assist in the switching of the cell and contribute to the cell stability and to the shielding of stray magnetic fields from and to other cells. They can also reduce half select probability.

The direction of the top and the bottom metal lines can also be interchanged respect to the cell orientation. Taking the configurations of FIGS. 3 and 6 as reference, the bottom metal line can be laid out in the left-right direction and the top metal line in the direction perpendicular to the drawing plane, as shown in FIG. 10. The combination with magnetic walls leads to the configurations shown in FIGS. 11 and 12. Although the magnetic behavior of the cells changes in these cases with respect to the configurations shown in FIGS. 3, 6, 8 and 9; the essence of the counterbalanced-switch mechanism does not change.

One important feature of all the Counterbalanced-Switch cells is that the bottom electrode for the MTJ does not need to go around any metal to connect to a read transistor. The bottom electrode can just go straight down to the read circuitry, taking no extra area beyond the dimensions of the MTJ stack. This represents an advantage over the conventional 1R1T MRAM configuration as there is no need to waste space in accommodating the bottom electrode. The cell density in Counterbalanced-Switch MRAM can be solely defined by the density of its underlying read circuitry and not by magnetic requirements.

Up to this point only the basic structure of Counterbalanced-Switch cells has been shown. In an actual implementation some of the layers numbered in FIG. 3 may be composed of several layers themselves, and there may be other auxiliary layers as well in the stack. FIG. 13 shows an illustrative embodiment of an actual layer structure for the MTJ stack. In this case the free layer 2 is a synthetic anti-ferromagnet where two FeCo layers are exchange coupled by a thin Ru layer. One of these FeCo layers must be thicker than the other. A Ta layer is placed on top of layer 2 for its protection. The fixed layer 1 in FIG. 13 is composed of a synthetic anti-ferromagnet with two equally thick FeCo layers. The IrMn anti-ferromagnetic layer, which is seated on top of a smooth Ta layer, must pin down the magnetization in the bottom FeCo layer. In one embodiment the layer structure of the stack lying in-between metal lines 4 and 5 is as shown in FIG. 14. Layer 8 in this case is a synthetic anti-ferromagnet where one FeCo layer must be thicker than the other. Layer 8 is sandwiched by Ta layers. In this case, layer 9 is a silicon nitride covering layer.

Counterbalanced-Switch MRAM cells can be manufactured using conventional Front-End and Back-End processes of CMOS device manufacturing.

Although the present invention has been described with reference to specific exemplary embodiments, it will be evident that the various modification and changes can be made to these embodiments without departing from the broader spirit of the invention. Accordingly, the specification and drawings are to be regarded in an illustrative sense rather than in a restrictive sense.

The invention claimed is:

1. A method for reducing current required to write to a magnetic storage layer of a magnetic memory cell, the method comprising:
    splitting the magnetic storage layer for the magnetic memory cell into first and second free magnetic layers; and
    magnetostatically coupling the first and second free magnetic layers by separating the layers by a metal line such that a magnetization direction of the first free magnetic layer is opposite a magnetization direction of the second free magnetic layer.

2. The method of claim 1, further comprising forming the first and second free magnetic layers such that each comprises a plurality of sub-layers.

3. The method of claim 1, further comprising configuring the metal line and another metal line to each carry a respective write current used to collectively energize the first and second free magnetic layers during write operations.

4. The method of claim 3, further comprising reducing the current required by the other metal line to write to the magnetic storage layer even further by forming the other metal line between the second free magnetic layer and a third free magnetic layer.

5. The method of claim 3, further comprising reducing the current required by the other metal line to write to the magnetic storage layer even further by placing a third free magnetic layer on the other metal line and opposite the second free magnetic layer.

6. The method of claim 1, further comprising forming the first and second free magnetic layers to have different materials, shapes, and dimensions.

7. The method of claim 1, further comprising introducing another metal line below the magnetic memory cell, without any lateral offset from the magnetic memory cell.

8. The method of claim 7, further comprising defining the write current through the first metal layer such that magnetization directions of the first and second free magnetic layers are not switched without a contribution from a write current of the other metal line for the magnetic memory cell.

9. The method of claim 1, further comprising covering a side wall of the metal line with magnetic material.

10. A magnetic memory cell, comprising:
    a first, second, and third metal line;
    a magnetic storage element including a first free magnetic layer coupled between the second and third metal lines; and
    a second free magnetic layer positioned between the first and second metal lines, wherein:
        the first and second free magnetic layers are magnetostatically coupled such that a magnetization direction of the first free magnetic layer is opposite a magnetization direction of the second free magnetic layer; and
        the first and second metal lines are configured to create a switching field in response to respective write currents that is sufficient to switch the magnetization directions of the first and second free magnetic layers.

11. The magnetic memory cell of claim 10, wherein the first and second free layers each comprise a plurality of sub-layers.

12. The magnetic memory cell of claim 11, further comprising a third free magnetic layer, wherein the first metal line is positioned between the first and third free magnetic layers.

13. The magnetic memory cell of claim 12, wherein the third free magnetic layer sits on the first metal line.

14. The magnetic memory cell of claim 11, wherein the first and second free magnetic layers have different materials, shapes, and dimensions.

15. The magnetic memory cell of claim 11, wherein the third metal line is not laterally offset from the magnetic storage element.

16. The magnetic memory cell of claim 11, wherein the magnetic storage element further comprises:
    a fixed magnetic layer; and
    a tunneling layer between the fixed magnetic layer and the first free magnetic layer.

17. The magnetic memory cell of claim 11, further comprising a dielectric layer between the first metal line and the second free magnetic layer.

18. The magnetic memory cell of claim 11, wherein a layer of magnetic material covers side walls of the first, second, and third metal lines.

19. The magnetic memory cell of claim 11, wherein:
    the first metal line is a bit line;
    the second metal line is a word line; and
    the third metal line is a read line.

20. The magnetic memory cell of claim 11, wherein:
    the first metal line is a word line;
    the second metal line is a bit line; and
    the third metal line is a read line.

* * * * *